(12) United States Patent
Takeda et al.

(10) Patent No.: US 7,267,923 B2
(45) Date of Patent: Sep. 11, 2007

(54) RESIST COMPOSITION AND PATTERNING PROCESS

(75) Inventors: Takanobu Takeda, Niigata-ken (JP); Osamu Watanabe, Niigata-ken (JP); Daisuke Manba, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/852,157

(22) Filed: May 25, 2004

(65) Prior Publication Data
US 2007/0148584 A1    Jun. 28, 2007

(30) Foreign Application Priority Data
May 26, 2003    (JP) .............................. 2003-147140

(51) Int. Cl.
*G03F 7/004*    (2006.01)
(52) U.S. Cl. .................... 430/270.1; 525/344
(58) Field of Classification Search ............. 430/270.1; 525/344
See application file for complete search history.

(56) References Cited

U.S. PATENT DOCUMENTS

| | | | |
|---|---|---|---|
| 4,491,628 A | 1/1985 | Ito et al. | |
| 4,603,101 A | 7/1986 | Crivello | |
| 5,252,435 A | 10/1993 | Tani et al. | |
| 5,310,619 A | 5/1994 | Crivello et al. | |
| 5,324,804 A | 6/1994 | Steinmann | |
| 5,770,343 A * | 6/1998 | Sato et al. | ................... 430/170 |
| 5,874,195 A * | 2/1999 | Sato et al. | ................... 430/170 |
| 5,976,759 A * | 11/1999 | Urano et al. | ............. 430/270.1 |
| 6,656,660 B1* | 12/2003 | Urano et al. | ............. 430/270.1 |
| 6,756,179 B2* | 6/2004 | Fujimori et al. | ......... 430/270.1 |

FOREIGN PATENT DOCUMENTS

| | | | |
|---|---|---|---|
| EP | 908473 A1 * | 4/1999 |
| EP | 1039346 A1 * | 9/2000 |
| EP | 1308782 A1 * | 5/2003 |
| JP | 62-115440 A | 5/1987 |
| JP | 63-27829 A | 2/1988 |
| JP | 2-27660 B2 | 1/1990 |
| JP | 3-223858 A | 10/1991 |
| JP | 3-275149 A | 12/1991 |
| JP | 4-211258 A | 8/1992 |
| JP | 6-100488 A | 4/1994 |
| JP | 6-289608 A | 10/1994 |
| JP | 2003084440 A * | 2/2003 |
| JP | 2003140350 A * | 5/2003 |

* cited by examiner

*Primary Examiner*—Amanda Walke
(74) *Attorney, Agent, or Firm*—Birch, Stewart, Kolasch & Birch, LLP

(57) ABSTRACT

Resist compositions comprising as the base resin a polymer having alkoxyisobutoxy as a reactive group which is decomposable under the action of an acid to increase solubility in alkali have advantages including a significantly enhanced contrast of alkali dissolution rate before and after exposure, a high sensitivity, and a high resolution in fine feature size regions. The compositions are best suited as a chemically amplified resist material for micropatterning in the manufacture of VLSI.

9 Claims, No Drawings

RESIST COMPOSITION AND PATTERNING PROCESS

This Nonprovisional application claims priority under 35 U.S.C. § 119(a) on Patent Application No(s). 2003-147140 filed in JAPAN on May 26, 2003, the entire contents of which are hereby incorporated by reference.

TECHNICAL FIELD

This invention relates to a resist composition, typically chemically amplified positive resist composition suitable for the fabrication of VLSI, comprising as the base resin a polymer containing alkoxyisobutoxy groups as reactive groups which are decomposable under the action of an acid to increase solubility in alkali, the composition having a wide temperature range for baking, a significantly high contrast of alkali dissolution rate before and after exposure, a high sensitivity, a high resolution, improved etch resistance, and a satisfactory resist pattern profile after development; and a patterning process using the resist composition.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. Deep-UV lithography is capable of achieving a minimum feature size of 0.5 μm or less and, when a resist having low light absorption is used, can form patterns with sidewalls that are nearly perpendicular to the substrate.

Recently developed acid-catalyzed chemical amplification positive resists, such as those described in JP-B 2-27660, JP-A 63-27829, U.S. Pat. No. 4,491,628 and U.S. Pat. No. 5,310,619, utilize a high-intensity KrF excimer laser as the deep-UV light source. These resists, with their excellent properties such as high sensitivity, high resolution, and good dry etching resistance, are especially promising for deep-UV lithography.

Such chemically amplified positive resists include two-component systems comprising a base resin and a photoacid generator, and three-component systems comprising a base resin, a photoacid generator, and a dissolution inhibitor having acid labile groups.

For example, JP-A 62-115440 describes a resist material comprising poly-p-tert-butoxystyrene and a photoacid generator, and JP-A 3-223858 describes a similar two-component resist material comprising a resin bearing tert-butoxy groups within the molecule, in combination with a photoacid generator. JP-A 4-211258 describes a two-component resist material which is comprised of polyhydroxystyrene bearing methyl, isopropyl, tert-butyl, tetrahydropyranyl, and trimethylsilyl groups, together with a photoacid generator.

JP-A 6-100488 discloses a resist material comprised of a polydihydroxystyrene derivative, such as poly[3,4-bis(2-tetrahydropyranyloxy)styrene], poly[3,4-bis(tert-butoxycarbonyloxy)styrene] or poly[3,5-bis(2-tetrahydropyranyloxy)styrene], and a photoacid generator.

The base resins in these resist materials have an optimum baking temperature as high as about 130° C. when the acid labile group is tert-butyl, and low resolution when the acid labile group is tert-butoxycarbonyl. In either case, the resist pattern tends to take on a T-top profile. By contrast, when the acid labile groups are alkoxyalkyl groups such as ethoxyethyl and 2-tetrahydropyranyl which are cleaved by weak acids, the corresponding resins have the drawback that the pattern configuration is considerably narrowed with the passage of time between exposure and heat treatment. This makes it difficult to form a resist film to a reduced thickness compliant with a reduced feature size. Also some resins have poor heat resistance so that lenses in the stepper can be contaminated by outgassing from within the resist during development. Because of these problems, none of the foregoing resins are compliant with micro-patterning.

To provide higher transparency and firm adhesion to substrates and to improve footing on substrates and etching resistance, JP-A 3-275149 and JP-A 6-289608 propose resist materials using copolymers of hydroxystyrene with a tertiary ester of (meth)acrylic acid. The resist materials of this type are not satisfactory because of poor heat resistance and an indefinite pattern profile after exposure.

With the current trend toward higher resolution, thinning of pattern film is in simultaneous progress. Accordingly, there is a desire to have a resist material having a definite resist pattern profile after exposure and higher etching resistance.

SUMMARY OF THE INVENTION

An object of the invention is to provide a resist composition, especially chemically amplified positive resist composition, which is superior to prior art positive resist compositions in sensitivity, resolution, exposure latitude and process flexibility, and has a satisfactory pattern profile after exposure and a wide temperature range for baking.

It has been found that a polymer comprising recurring units of the general formula (1), (2), (3) or (4), shown below, and having a weight average molecular weight of 1,000 to 500,000 is an effective base resin in a positive resist composition, especially chemically amplified positive resist composition. The chemically amplified positive resist composition containing a photoacid generator and an organic solvent as well as the polymer can form a resist film having many advantages including an increased dissolution contrast, high resolution, improved latitude of exposure, a wide temperature range for baking, improved process flexibility, and a good pattern profile after exposure, and has an ability to form a resist film of reduced thickness compliant with a reduced feature size. The composition is thus suited for practical use and advantageously used in precise microfabrication, especially in VLSI manufacture.

In a first aspect, the invention provides a resist composition comprising a polymer comprising recurring units of the following general formula (1) and having a weight average molecular weight of 1,000 to 500,000.

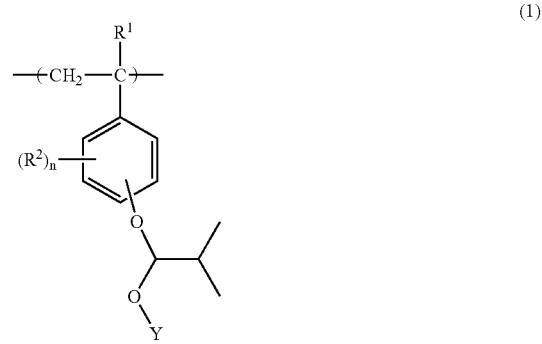

Herein $R^1$ is hydrogen, hydroxy, a straight or branched alkyl group, halogen atom or trifluoromethyl group, $R^2$ is hydrogen, hydroxy, a halogen atom or trifluoromethyl group, Y is methyl, ethyl or propyl, and n is 0 or a positive integer of 1 to 4.

The invention also provides a resist composition comprising a polymer comprising recurring units of the following general formula (2) and having a weight average molecular weight of 1,000 to 500,000.

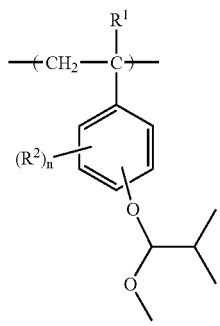
(2)

Herein $R^1$ is hydrogen, hydroxy, a straight or branched alkyl group, halogen atom or trifluoromethyl group, $R^2$ is hydrogen, hydroxy, a halogen atom or trifluoromethyl group, and n is 0 or a positive integer of 1 to 4.

One preferred embodiment is a resist composition comprising a polymer comprising recurring units of the following general formula (3) and having a weight average molecular weight of 1,000 to 500,000.

(3)

Herein each of $R^1$ and $R^3$ is hydrogen, hydroxy, a straight or branched alkyl group, halogen atom or trifluoromethyl group, $R^2$ is hydrogen, hydroxy, a halogen atom or trifluoromethyl group, $R^4$ is hydrogen, a substituted or unsubstituted alkyl group, substituted or unsubstituted alkoxy group or ditrifluoromethylhydroxymethyl group, $R^5$ is hydrogen or methyl, $R^6$ is a hydrogen atom, methyl group, alkoxycarbonyl group, cyano group, halogen atom, or trifluoromethyl group, $R^7$ is a $C_4$-$C_{30}$ alkyl group, Y is methyl, ethyl or propyl, n is 0 or a positive integer of 1 to 4, m is 0 or a positive integer of 1 to 5, r and s are 0 or positive numbers, and p and q are positive numbers.

Another preferred embodiment is a resist composition comprising a polymer comprising recurring units of the following general formula (4) and having a weight average molecular weight of 1,000 to 500,000.

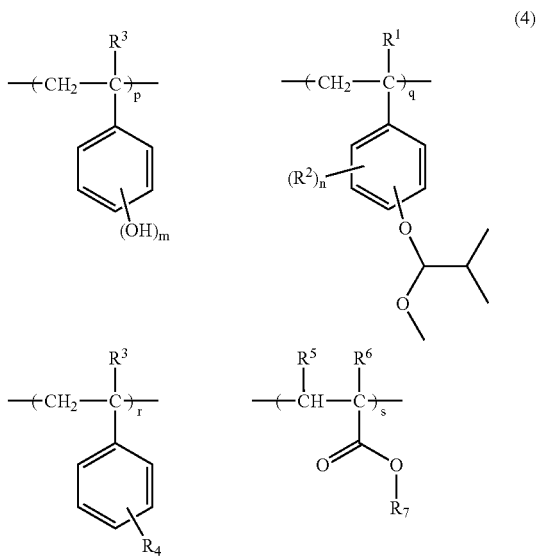
(4)

Herein each of $R^1$ and $R^3$ is hydrogen, hydroxy, a straight or branched alkyl group, halogen atom or trifluoromethyl group, $R^2$ is hydrogen, hydroxy, a halogen atom or trifluoromethyl group, $R^4$ is hydrogen, a substituted or unsubstituted alkyl group, substituted or unsubstituted alkoxy group or ditrifluoromethylhydroxymethyl group, $R^5$ is hydrogen or methyl, $R^6$ is a hydrogen atom, methyl group, alkoxycarbonyl group, cyano group, halogen atom, or trifluoromethyl group, $R^7$ is a $C_4$-$C_{30}$ alkyl group, n is 0 or a positive integer of 1 to 4, m is 0 or a positive integer of 1 to 5, r and s are 0 or positive numbers, and p and q are positive numbers.

A still further embodiment is a resist composition comprising a polymer obtained by the reaction under basic conditions of a phenolic resin with a compound of the following general formula (5).

(5)

Herein X is a chlorine, bromine or iodine atom and Y is methyl, ethyl or propyl.

In a second aspect, the invention provides a chemically amplified positive resist composition comprising (A) an organic solvent, (B) the aforementioned polymer as a base resin, and (C) a photoacid generator. Optionally, the resist composition further includes (D) a dissolution inhibitor and (E) a basic compound.

In a third aspect, the invention provides a process for forming a pattern comprising the steps of (i) applying the resist composition of the second aspect onto a substrate to form a coating, (ii) heat treating the coating and then exposing it to high-energy radiation or electron beam through a photo mask, and (iii) optionally heat treating the exposed coating and developing it with a liquid developer.

DESCRIPTION OF THE PREFERRED EMBODIMENT

The resist compositions of the invention include polymers or high molecular weight compounds comprising recurring units of the following general formula (1), preferably the following general formula (2), more preferably the following general formula (3) or (4), as the base resin.

(1)

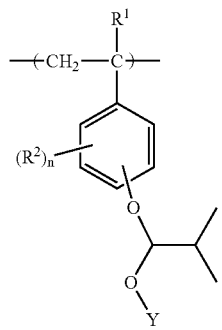

(2)

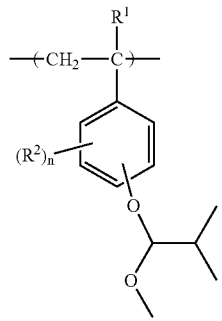

Herein $R^1$ is a hydrogen atom, a hydroxy group, a straight or branched alkyl group, a halogen atom or a trifluoromethyl group. $R^2$ is a hydrogen atom, a hydroxy group, a halogen atom or a trifluoromethyl group. Y is methyl, ethyl or propyl. The subscript n is 0 or a positive integer of 1 to 4.

(3)

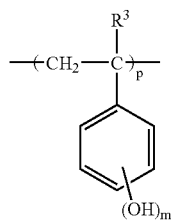 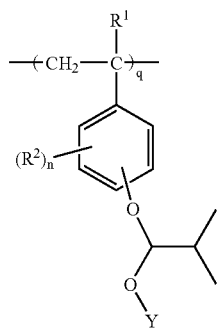

-continued

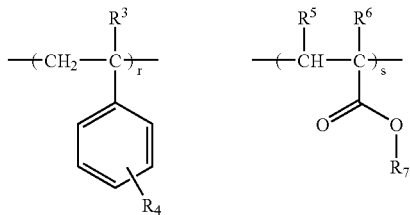

(4)

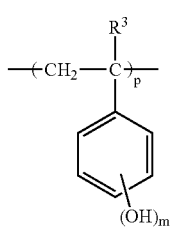 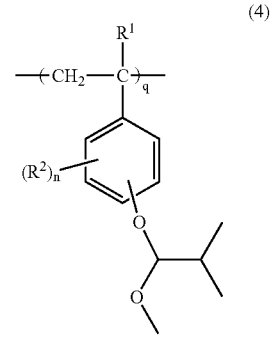

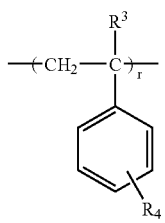 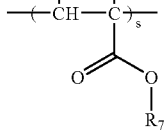

Herein each of $R^1$ and $R^3$ is a hydrogen atom, a hydroxy group, a straight or branched alkyl group, a halogen atom or a trifluoromethyl group. $R^2$ is a hydrogen atom, a hydroxy group, a halogen atom or a trifluoromethyl group. $R^4$ is a hydrogen atom, a substituted or unsubstituted alkyl group, a substituted or unsubstituted alkoxy group or a ditrifluoromethylhydroxymethyl group. $R^5$ is hydrogen or methyl. $R^6$ is a hydrogen atom, a methyl group, an alkoxycarbonyl group, a cyano group, a halogen atom, or a trifluoromethyl group. $R^7$ is a $C_4$-$C_{30}$ alkyl group. Y is methyl, ethyl or propyl. The subscript n is 0 or a positive integer of 1 to 4, m is 0 or a positive integer of 1 to 5, each of r and s is 0 or a positive number, and each of p and q is a positive number.

In one embodiment, the resist composition includes as the base resin a polymer obtained by the reaction under basic conditions of a phenolic resin with a compound of the following general formula (5).

(5)

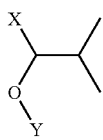

Herein X is a chlorine, bromine or iodine atom and Y is methyl, ethyl or propyl.

The straight or branched alkyl groups represented by $R^1$ and $R^3$ are preferably those of 1 to 5 carbon atoms, and include, for example, methyl, ethyl, propyl, isopropyl, n-butyl, isobutyl and tert-butyl.

The alkoxycarbonyl groups represented by $R^6$ are preferably those of 2 to 10 carbon atoms, especially 2 to 5 carbon atoms, and include, for example, methoxycarbonyl, t-butoxycarbonyl and t-butoxycarbonylmethyl.

When $R^1$, $R^2$, $R^3$ and $R^6$ represent halogen atoms, exemplary are fluorine, chlorine and bromine atoms.

The substituted or unsubstituted alkyl and alkoxy groups represented by $R^4$ are preferably those of 1 to 20 carbon atoms, more preferably 1 to 7 carbon atoms, and especially, those groups substituted so as to have an acid labile group function.

Where $R^4$ has an acid labile group function, the group is selected from a variety of acid labile function groups. The preferred acid labile groups are groups of the following general formulae (6) and (7), straight, branched or cyclic, tertiary alkoxy groups of 4 to 20 carbon atoms, trialkylsiloxy groups whose alkyl groups each have 1 to 6 carbon atoms, oxoalkoxy groups of 4 to 20 carbon atoms, tetrahydropyranyloxy, tetrahydrofuranyloxy, and trialkylsiloxy groups whose alkyl groups each have 1 to 6 carbon atoms such as trimethylsiloxy.

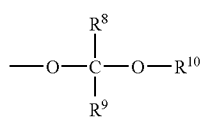

(6)

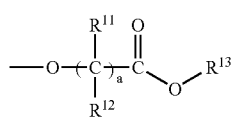

(7)

Herein $R^8$, $R^9$, $R^{10}$, $R^{11}$ and $R^{12}$ are independently hydrogen or straight or branched alkyl groups of 1 to 8 carbon atoms. $R^{10}$ may also be a monovalent hydrocarbon group of 1 to 18 carbon atoms which may be separated by an oxygen atom. A pair of $R^8$ and $R^9$, a pair of $R^8$ and $R^{10}$, and a pair of $R^9$ and $R^{10}$, taken together, may form a ring with the carbon atom to which they are attached. $R^8$, $R^9$ and $R^{10}$ each are a straight or branched alkylene group of 1 to 18 carbon atoms when they form a ring. $R^{13}$ is a straight, branched or cyclic alkyl group of 4 to 40 carbon atoms. The subscript "a" is 0 or an integer of 1 to 4.

Examples of the acid labile group of formula (6) include methoxyethyl, ethoxyethyl, n-propoxyethyl, isopropoxyethyl, n-butoxyethyl, isobutoxyethyl, tert-butoxyethyl, cyclohexyloxyethyl, methoxypropyl and ethoxypropyl groups, each having an intervening oxygen atom. Examples of the acid labile group of formula (7) include tert-butoxycarbonyloxy, tert-butoxycarbonylmethyloxy, ethylcyclopentylcarbonyloxy, ethylcyclohexylcarbonyloxy and methylcyclopentylcarbonyloxy groups.

In formulae (3) and (4), $R^7$ represents alkyl groups of 4 to 30 carbon atoms, preferably 4 to 20 carbon atoms, which may be either straight, branched or cyclic. When $R^7$ is a tertiary alkyl group, it is selected from a variety of such groups, especially groups of the general formulae (8) and (9).

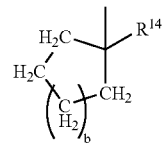

(8)

Herein $R^{14}$ is a methyl, ethyl, isopropyl, cyclohexyl, cyclopentyl, vinyl, acetyl, phenyl, benzyl or cyano group, and b is an integer of 0 to 3.

The cyclic alkyl groups of formula (8) are preferably 5-membered rings. Illustrative examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl and 1-cyanocyclohexyl.

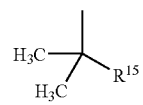

(9)

Herein $R^{15}$ is a methyl, ethyl, isopropyl, cyclohexyl, cyclopentyl, vinyl, phenyl, benzyl or cyano group.

Illustrative examples of the groups of formula (9) include t-butyl, 1-vinyldimethyl, 1-benzyldimethyl, 1-phenyldimethyl and 1-cyanodimethyl.

Also preferred as $R^7$ are alkyl groups forming tertiary esters as shown by the formulae (10)-1 to (10)-4 below.

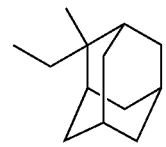

(10)-1

(10)-2

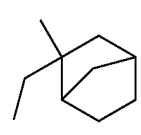

(10)-3

(10)-4

The alkoxyisobutyloxystyrene (acid labile group moiety) included essentially in the inventive polymer ensures that a resist composition formulated from the polymer forms a quite satisfactory resist pattern shape after development and has a high etching resistance, as compared with conventional ethoxyethoxystyrene and ethoxypropoxystyrene. Additionally, Y in formulae (1) and (3) is methyl, ethyl or propyl. Preference is given to methyl, then to ethyl and then to propyl as long as the pattern shape is concerned. When other factors have to be taken into account, Y may be selected as appropriate from among methyl, ethyl and propyl.

Further in formula (3) or (4), p and q are positive numbers and r and s are 0 or positive numbers and preferably satisfy the following relationship, when properties of resist compositions are taken into account.

That is, p, q, r and s satisfy the relationship:

$$0 \leq q/(p+q+r+s) \leq 0.5,$$

preferably $0.10 \leq q/(p+q+r+s) \leq 0.35,$ $$0 \leq p/(p+q+r+s) \leq 0.8,$$

preferably $0.3 \leq p/(p+q+r+s) \leq 0.8,$ $$0 \leq r/(p+q+r+s) \leq 0.35, \text{ and}$$

$$0 \leq s/(p+q+r+s) \leq 0.35.$$

If q=0, that is, if the polymer of formula (3) or (4) does not contain the q-suffixed units, a contrast in alkali dissolution rate is lost and the resolution becomes poor. Too high a proportion of p may lead to too high an alkali dissolution rate in unexposed areas. Suitable selection of the numbers p, q, r and s within the above ranges makes it possible to control the pattern dimensions and the pattern shape as desired.

The inventive polymers should have a weight average molecular weight (Mw) of about 1,000 to 500,000 and preferably about 2,000 to 30,000. With too low Mw, polymers become less resistant to heat. Polymers with too high Mw have low alkali solubility and tend to induce a footing phenomenon after pattern formation.

It is recommended that the multi-component copolymer of formula (3) or (4) have a controlled molecular weight dispersity (Mw/Mn). If a copolymer has a wide dispersity, it contains more polymer fractions of low molecular weight and high molecular weight and thus forms a pattern after exposure with foreign matter left thereon or its shape collapsed. The influence of a molecular weight and its dispersity becomes greater as the pattern rule becomes finer. In order that a resist composition be advantageously used in patterning features to a finer size, the multi-component copolymer should preferably be a narrow disperse one having a molecular weight dispersity of 1.0 to 1.8, especially 1.0 to 1.2.

In one typical embodiment, the polymer can be synthesized by dissolving a polymer (high molecular weight compound) having phenolic hydroxyl groups in an organic solvent, and adding dropwise a compound of formula (5) thereto under basic conditions, whereupon reaction takes place. The resulting polymer is washed, crystallized and dried. The target polymer is obtained in this way. Examples of the organic solvent for the polymer having phenolic hydroxyl groups include tetrahydrofuran, diethyl ether, ethyl acetate and dioxane. Preferred additives used for rendering the reaction system basic include triethylamine, pyridine, aqueous ammonia, diisopropylamine and potassium carbonate. Such a basic additive is preferably used in an amount of at least 1.5 equivalents per mole of the compound of formula (5). The reaction temperature is often in the range of −20° C. to 100° C., preferably 0° C. to 50° C. The reaction time is about 0.2 to 100 hours, preferably about 0.5 to 20 hours.

As alternative methods, the polymer can be synthesized by dissolving a polymer having phenolic hydroxyl groups in an organic solvent and adding an alkyl butenyl ether thereto in the presence of an acid catalyst, or by copolymerizing an acetoxystyrene monomer and an alkoxyisobutyloxystyrene monomer and subjecting acetoxy groups to deblocking reaction under basic conditions. The inventive polymer is not limited to a particular preparation method.

It is further possible that once the thus synthesized polymer is isolated, the acid labile group of formula (6) be introduced into the phenolic hydroxyl group portion thereof. For example, phenolic hydroxyl groups on the polymer are reacted with a conventional haloalkyl ether compound in the presence of a base to produce a polymer in which phenolic hydroxyl groups are, in part, protected with conventional alkoxyalkyl groups.

The reaction solvent used in this stage is preferably selected from aprotic polar solvents such as acetonitrile, acetone, dimethylformamide, dimethylacetamide, tetrahydrofuran and dimethyl sulfoxide. Such solvents may be used alone or in admixture of any. Preferred bases include triethylamine, pyridine, diisopropylamine and potassium carbonate. The amount of base used is preferably at least 10 mol % based on the moles of entire phenolic hydroxyl groups on the polymer to be reacted. The reaction temperature is often in the range of about −50° C. to 100° C., and preferably about 0° C. to 60° C. The reaction time is from about 0.5 to 100 hours, and preferably about 1 to 20 hours.

When it is desired to introduce acid labile groups of formula (7), a polymer (high molecular weight compound) is reacted with a dialkyl dicarbonate compound or alkoxycarbonylalkyl halide in a solvent in the presence of a base. The reaction solvent used is preferably selected from aprotic polar solvents such as acetonitrile, acetone, dimethylformamide, dimethylacetamide, tetrahydrofuran and dimethyl sulfoxide. Such solvents may be used alone or in admixture of any. Preferred bases include triethylamine, pyridine, imidazole, diisopropylamine and potassium carbonate. The amount of base used is preferably at least 10 mol % based on the moles of entire phenolic hydroxyl groups on the starting polymer. The reaction temperature is often in the range of about 0° C. to 100° C., and preferably about 0° C. to 60° C. The reaction time is from about 0.2 to 100 hours, and preferably about 1 to 10 hours.

Exemplary of the dialkyl dicarbonate compound are di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide and tert-butoxycarbonylethyl chloride.

Resist Composition

The resist composition of the invention uses the above-mentioned polymer as a base resin and is typically positive working and especially useful as a chemically amplified positive resist composition. Specifically the chemically amplified positive resist composition comprises (A) an organic solvent, (B) the above-mentioned polymer as a base resin, and (C) a photoacid generator. If desired, the resist composition further includes (D) a dissolution inhibitor and/or (E) a basic compound.

In the chemically amplified, positive working resist composition of the invention, component (A) is an organic solvent. Illustrative, non-limiting, examples of the solvent include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methylpyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the solids in the chemically amplified positive resist composition. The concentration is not limited to this range as long as film formation by existing methods is possible.

The photoacid generator (C) is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, and hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Of these photoacid generators, the sulfonium salts, bis-sulfonyldiazomethane compounds, and N-sulfonyloxyimide compounds are preferred.

While the anion of the optimum acid to be generated differs depending on the ease of scission of acid labile groups introduced in the polymer, an anion which is nonvolatile and not extremely diffusive is generally chosen. The preferred anions include benzenesulfonic acid anions, toluenesulfonic acid anions, 4-(4-toluenesulfonyloxy)benzenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

In the chemically amplified positive resist composition, an appropriate amount of the photoacid generator (C) is 0.1 to 20 parts, more preferably 1 to 10 parts by weight per 100 parts by weight of the base resin in the composition. The photoacid generators may be used alone or in admixture of two or more. The transmittance of the resist film can be controlled by using a photoacid generator having a low transmittance at the exposure wavelength and adjusting the amount of the photoacid generator added.

The dissolution inhibitor (D) is a compound having on the molecule at least two phenolic hydroxyl groups, in which an average of from 10 to 100 mol % of all the hydrogen atoms on the phenolic hydroxyl groups are replaced with acid labile groups. The compound has a weight average molecular weight within the range of 100 to 1,000, and preferably 150 to 800. The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. Less amounts of the dissolution inhibitor may fail to yield an improved resolution, whereas too much amounts would lead to slimming of the patterned film, and thus a decline in resolution.

Illustrative, non-limiting, examples of the dissolution inhibitor (D) which are useful herein include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)-valerate, tert-butyl 4,4-bis(4'-(2"-tetrahydrofuranyloxy)phenyl)-valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)-valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, and 1,1,2-tris(4'-(1'-ethoxypropyloxy)phenyl)ethane.

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl) pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, arginine, aspartic acid, glutamic acid, glycine, histidine, isoleucine, glycyl, leucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)_n(Y)_{3-n} \quad (B)\text{-}1$$

In the formula, n is equal to 1, 2 or 3; side chain X, which may be the same or different, is independently selected from groups of the following general formulas (X)-1 to (X)-3, and two or three X's may bond together to form a ring; and side chain Y, which may be the same or different, is independently hydrogen or a straight, branched or cyclic alkyl group of 1 to 20 carbon atoms which may contain a hydroxyl group or ether.

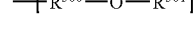

(X)-1

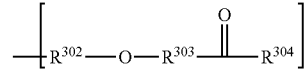

(X)-2

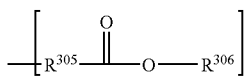

(X)-3

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl]-ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

The basic compounds may be used alone or in admixture of two or more. The basic compound is preferably formulated in an amount of 0 to 2 parts, and especially 0.01 to 1 part by weight, per 100 parts by weight of the base resin in the resist composition. The use of more than 2 parts of the basic compound may result in too low a sensitivity.

In the resist composition, a surfactant may be added for improving coating characteristics. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Fluorad FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part by weight, per 100 parts by weight of the base resin in the resist composition.

For the microfabrication of integrated circuits, any well-known lithography may be used to form a resist pattern from the chemical amplification, positive working, resist composition of the invention.

The composition is applied onto a substrate (on which an integrated circuit is to be formed, e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 μm thick. With a mask having a desired pattern placed above the resist film, the resist film is then exposed to actinic radiation, preferably having an exposure wavelength of up to 300 nm, such as UV, deep-UV, electron beams, x-rays, excimer laser light, γ-rays and synchrotron radiation in an exposure dose of about 1 to 200 mJ/cm², preferably about 10 to 100 mJ/cm². The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dipping, puddling or spraying. In this way, a desired resist pattern is formed on the substrate. It is appreciated that the resist composition of the invention is best suited for micropatterning using such actinic radiation as deep UV with a wavelength of 254 to 193 nm, vacuum UV with a wavelength of 157 nm, electron beams, soft x-rays, x-rays, excimer laser light, γ-rays and synchrotron radiation. With any of the above-described parameters outside the above-described range, the process may sometimes fail to produce the desired pattern.

EXAMPLE

Examples of the invention are given below by way of illustration and not by way of limitation. The abbreviation Mw is a weight average molecular weight, Mn is a number average molecular weight, Mw/Mn is a molecular weight dispersity, NMR is nuclear magnetic resonance, GPC is gel permeation chromatography.

Synthesis Example 1

A 2-liter flask reaction vessel was dried under reduced pressure. In a nitrogen atmosphere, 1,500 g of tetrahydrofuran which had been dewatered by distillation was poured and cooled to −75° C. Then 13.5 g of s-butyllithium (1N cyclohexane solution) was injected, and 235 g of p-t-butoxystyrene which had been dewatered by distillation in the presence of metallic sodium was added dropwise. Addition was carefully done so that the internal temperature of the reaction solution might not exceed −65° C. After 30 minutes of reaction, 10 g of methanol was injected to stop the reaction. The reaction solution was warmed up to room temperature and concentrated under reduced pressure. The procedure of adding 800 g of methanol to the concentrate, agitating, holding stationary, and removing the upper layer, methanol layer was repeated three times, removing the metallic lithium. The lower layer, polymer solution was concentrated, to which 840 ml of acetone and 13.3 g of an aqueous hydrochloric acid solution (15 wt %) were added. The solution was heated at 40° C., at which deblocking reaction took place for 5 hours. The reaction solution was neutralized with 37 g of pyridine, concentrated, and dissolved in 0.6 liter of acetone. This was poured into 7.0 liters of water for precipitation and washing. The white solids were collected by filtration and dried at 40° C. under reduced pressure, obtaining 138 g of a white polymer. The polymer was analyzed by $^{13}$C- and $^1$H-NMR and GPC, with the results shown below.

Copolymer compositional ratio
poly-4-hydroxystyrene
Mw=10,200
Mw/Mn=1.05
This is designated Poly-1.

Synthesis Example 2

A 1-liter flask was charged with 50.1 g of polyhydroxystyrene (Poly-1) and 450 g of tetrahydrofuran as a solvent. To the reactor which was cooled to 5° C. in a nitrogen atmosphere, 43.4 g of triethylamine was added, and 20.4 g of acetalizing agent A, shown below, was added dropwise over one hour. The reactor was warmed up to room temperature, followed by reaction for 2 hours. The reaction solution was concentrated, dissolved in 300 g of acetone, neutralized with acetic acid and poured into 7.0 liters of water for washing whereupon the product crystallized and precipitated. The white solids were collected by filtration and dried at 40° C. under reduced pressure, obtaining 52.0 g of a white polymer. The polymer was analyzed by $^{13}$C- and $^1$H-NMR and GPC, with the results shown below.

Copolymer compositional ratio
hydroxystyrene:4-methoxyisobutoxystyrene=72.0: 28.0
Mw=14,000
Mw/Mn=1.10
This is designated Poly-A.

Synthesis Example 3

A 1-liter flask was charged with 50.0 g of polyhydroxystyrene (Poly-1) and 450 g of tetrahydrofuran as a solvent. To the reactor which was cooled to 5° C. in a nitrogen atmosphere, 43.4 g of triethylamine was added, and 19.8 g of acetalizing agent B, shown below, was added dropwise over one hour. The reactor was warmed up to room temperature, followed by reaction for 20 hours. The reaction solution was concentrated, dissolved in 300 g of acetone, neutralized with acetic acid and poured into 7.0 liters of water for washing whereupon the product crystallized and precipitated. The white solids were collected by filtration and dried at 40° C. under reduced pressure, obtaining 49.5 g of a white polymer. The polymer was analyzed by $^{13}$C- and $^1$H-NMR and GPC, with the results shown below.

Copolymer compositional ratio
hydroxystyrene:4-ethoxyisobutoxystyrene=73.1:26.9
Mw=14,900
Mw/Mn=1.10
This is designated Poly-B.

Synthesis Example 4

A 1-liter flask was charged with 50.3 g of polyhydroxystyrene (Poly-1) and 550 g of tetrahydrofuran as a solvent. To the reactor which was cooled to 5° C. in a nitrogen atmosphere, 47.6 g of triethylamine was added, and 21.1 g of acetalizing agent C, shown below, was added dropwise over one hour. The reactor was warmed up to room temperature, followed by reaction for 20 hours. The reaction solution was concentrated, dissolved in 300 g of acetone, neutralized with acetic acid and poured into 7.0 liters of water for washing whereupon the product crystallized and precipitated. The white solids were collected by filtration and dried at 40° C. under reduced pressure, obtaining 48.7 g of a white polymer. The polymer was analyzed by $^{13}$C- and $^1$H-NMR and GPC, with the results shown below.

Copolymer compositional ratio
hydroxystyrene:4-propoxyisobutoxystyrene=75.6:24.4
Mw=15,100
Mw/Mn=1.11
This is designated Poly-C.

Synthesis Example 5

A 2-liter flask reaction vessel was dried under reduced pressure. In a nitrogen atmosphere, 1,500 g of tetrahydrofuran which had been dewatered by distillation was poured and cooled to −75° C. Then 14.3 g of s-butyllithium (1N cyclohexane solution) was injected, and a mixture of 121.1 g of 4-ethoxyethoxystyrene which had been dewatered by distillation in the presence of metallic sodium and 16.8 g of 4-t-butoxystyrene which had been similarly dewatered was added dropwise. Addition was carefully done so that the internal temperature of the reaction solution might not exceed −65° C. After 30 minutes of reaction, 10 g of methanol was injected to stop the reaction. The reaction solution was warmed up to room temperature and concentrated under reduced pressure. The procedure of adding 800 g of methanol to the concentrate, agitating, holding stationary, and removing the upper layer, methanol layer was repeated three times, removing the metallic lithium. The lower layer, polymer solution was concentrated, to which 840 ml of tetrahydrofuran, 630 ml of methanol, and 3.2 g of oxalic acid were added. The solution was heated at 40° C., at which deblocking reaction took place for 20 hours. The reaction solution was neutralized with 35 g of pyridine, concentrated, and dissolved in 0.6 liter of acetone. This was poured into 7.0 liters of water for precipitation and washing. The white solids were collected by filtration and dried at 40° C. under reduced pressure, obtaining 86.9 g of a white polymer. The polymer was analyzed by $^{13}$C- and $^{1}$H-NMR and GPC, with the results shown below.

Copolymer compositional ratio
hydroxystyrene:4-t-butoxystyrene=87.8:12.2
Mw=8,600
Mw/Mn=1.04
This is designated Poly-2.

Synthesis Example 6

A 2-liter flask reaction vessel was dried under reduced pressure. In a nitrogen atmosphere, 1,500 g of tetrahydrofuran which had been dewatered by distillation was poured and cooled to −75° C. Then 14.5 g of s-butyllithium (1N cyclohexane solution) was injected, and a mixture of 126.1 g of 4-ethoxyethoxystyrene which had been dewatered by distillation in the presence of metallic sodium and 13.4 g of 4-(2-methyl-2-butyloxy)styrene which had been similarly dewatered was added dropwise. Addition was carefully done so that the internal temperature of the reaction solution might not exceed −65° C. After 30 minutes of reaction, 10 g of methanol was injected to stop the reaction. The reaction solution was warmed up to room temperature and concentrated under reduced pressure. The procedure of adding 800 g of methanol to the concentrate, agitating, holding stationary, and removing the upper layer, methanol layer was repeated three times, removing the metallic lithium. The lower layer, polymer solution was concentrated, to which 840 ml of tetrahydrofuran, 630 ml of methanol, and 3.2 g of oxalic acid were added. The solution was heated at 40° C., at which deblocking reaction took place for 20 hours. The reaction solution was neutralized with 35 g of pyridine, concentrated, and dissolved in 0.6 liter of acetone. This was poured into 7.0 liters of water for precipitation and washing. The white solids were collected by filtration and dried at 40° C. under reduced pressure, obtaining 78.1 g of a white polymer. The polymer was analyzed by $^{13}$C- and $^{1}$H-NMR and GPC, with the results shown below.

Copolymer compositional ratio
hydroxystyrene:2-methyl-2-butyloxystyrene=90.4:9.6
Mw=8,300
Mw/Mn=1.03
This is designated Poly-3.

Synthesis Example 7

A 1-liter flask was charged with 50.2 g of the polymer (Poly-2) and 450 g of tetrahydrofuran as a solvent. To the reactor which was cooled to 5° C. in a nitrogen atmosphere, 24.5 g of triethylamine was added, and 9.9 g of acetalizing agent A, shown below, was added dropwise over one hour. The reactor was warmed up to room temperature, followed by reaction for 2 hours. The reaction solution was concentrated, dissolved in 300 g of acetone, neutralized with acetic acid and poured into 7.0 liters of water for washing whereupon the product crystallized and precipitated. The white solids were collected by filtration and dried at 40° C. under reduced pressure, obtaining 46.5 g of a white polymer. The polymer was analyzed by $^{13}$C- and $^{1}$H-NMR and GPC, with the results shown below.

Copolymer compositional ratio
hydroxystyrene:4-methoxyisobutoxystyrene:4-t-butoxystyrene=69.0:18.8:12.2
Mw=10,100
Mw/Mn=1.04
This is designated Poly-D.

Synthesis Example 8

A 1-liter flask was charged with 50.0 g of the polymer (Poly-3) and 450 g of tetrahydrofuran as a solvent. To the reactor which was cooled to 5° C. in a nitrogen atmosphere, 24.5 g of triethylamine was added, and 10.0 g of acetalizing agent A, shown below, was added dropwise over one hour. The reactor was warmed up to room temperature, followed by reaction for 2 hours. The reaction solution was concentrated, dissolved in 300 g of acetone, neutralized with acetic acid and poured into 7.0 liters of water for washing whereupon the product crystallized and precipitated. The white solids were collected by filtration and dried at 40° C. under reduced pressure, obtaining 49.1 g of a white polymer. The polymer was analyzed by $^{13}$C- and $^{1}$H-NMR and GPC, with the results shown below.

Copolymer compositional ratio
hydroxystyrene:4-methoxyisobutoxystyrene:2-methyl-2-butyloxystyrene=71.3:19.1:9.6
Mw=11,000
Mw/Mn=1.04
This is designated Poly-E.

Synthesis Example 9

To a 2-liter flask were added 177.8 g of 4-acetoxystyrene, 22.2 g of 1-ethylcyclopentyl methacrylate and 500 g of toluene as a solvent. The reactor was cooled to −65° C. in a nitrogen atmosphere, whereupon vacuum deaeration and nitrogen blow were repeated three times. The reactor was warmed up to room temperature, 12.0 g of azobisisobutyronitrile (AIBN) was added as a polymerization initiator, and the reactor was further heated to 60° C., at which reaction was effected for 20 hours. The reaction solution was concentrated to a 1/2 volume and poured into a mixture of 4.5 liters methanol and 0.5 liter water for precipitation. The resulting white solids were filtered and vacuum dried at 60° C., obtaining 160 g of a white polymer. The polymer was dissolved in a mixture of 0.54 liter methanol and 0.54 liter tetrahydrofuran again, to which 144 g of triethylamine and 28 g of water were added whereupon deblocking reaction took place at 60° C. for 20 hours. The reaction solution was neutralized with acetic acid, concentrated, and dissolved in 0.5 liter of acetone. Following precipitation, filtration and drying in the same way as above, 106 g of a white polymer was obtained.

The polymer was analyzed by $^{13}$C-NMR, $^1$H-NMR and GPC, with the analytical results shown below.

Copolymer compositional ratio
hydroxystyrene:1-ethylcyclopentyl methacrylate=90.8:9.2
Mw=13,000
Mw/Mn=1.54
This polymer is designated Poly-4.

Synthesis Example 10

A 1-liter flask was charged with 30.0 g of the polymer (Poly-4) and 200 g of tetrahydrofuran as a solvent. To the reactor which was cooled to 5° C. in a nitrogen atmosphere, 25.0 g of triethylamine was added, and 7.7 g of acetalizing agent A, shown below, was added dropwise over one hour. The reactor was warmed up to room temperature, followed by reaction for 20 hours. The reaction solution was concentrated, dissolved in 200 g of acetone, neutralized with acetic acid and poured into 7.0 liters of water for washing whereupon the product crystallized and precipitated. The white solids were collected by filtration and dried at 40° C. under reduced pressure, obtaining 28.2 g of a white polymer. The polymer was analyzed by $^{13}$C- and $^1$H-NMR and GPC, with the results shown below.

Copolymer compositional ratio
hydroxystyrene:4-methoxyisobutoxystyrene:1-ethylcyclopentyl methacrylate=69.5:21.3:9.2
Mw=16,200
Mw/Mn=1.60
This is designated Poly-F.

Comparative Synthesis Example 1

A 1-liter flask was charged with 50.0 g of the polymer (Poly-1) and 450 g of tetrahydrofuran as a solvent. To the reactor which was cooled to 10° C. in a nitrogen atmosphere, 1.5 g of methanesulfonic acid was added, and 10.6 g of ethyl vinyl ether was added dropwise over 0.5 hour. The reactor was warmed up to room temperature, followed by reaction for 0.5 hour. The reaction solution was neutralized with 7.0 g of aqueous ammonia to stop the reaction. The reaction solution was concentrated, dissolved in 300 g of acetone, neutralized with acetic acid and poured into 7.0 liters of water for washing whereupon the product crystallized and precipitated. The white solids were collected by filtration and dried at 40° C. under reduced pressure, obtaining 52.3 g of a white polymer. The polymer was analyzed by $^{13}$C- and $^1$H-NMR and GPC, with the results shown below.

Copolymer compositional ratio
hydroxystyrene:4-ethoxyethoxystyrene=67.9:32.1
Mw=13,900
Mw/Mn=1.09
This is designated Poly-G.

Comparative Synthesis Example 2

A 1-liter flask was charged with 49.8 g of the polymer (Poly-1) and 450 g of tetrahydrofuran as a solvent. To the reactor which was cooled to 10° C. in a nitrogen atmosphere, 1.5 g of methanesulfonic acid was added, and 8.2 g of ethyl propenyl ether was added dropwise over 0.5 hour. The reactor was warmed up to room temperature, followed by reaction for one hour. The reaction solution was neutralized with 7.0 g of aqueous ammonia to stop the reaction. The reaction solution was concentrated, dissolved in 300 g of acetone, neutralized with acetic acid and poured into 7.0 liters of water for washing whereupon the product crystallized and precipitated. The white solids were collected by filtration and dried at 40° C. under reduced pressure, obtaining 50.1 g of a white polymer. The polymer was analyzed by $^{13}$C- and $^1$H-NMR and GPC, with the results shown below.

Copolymer compositional ratio
hydroxystyrene:4-ethoxypropoxystyrene=72.2:27.8
Mw=14,400
Mw/Mn=1.12
This is designated Poly-H.

Acetalizing agents A to C and polymers Poly-A to H have the structural formulae shown below.

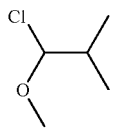

Acetalizing agent A

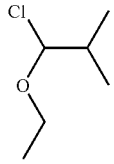

Acetalizing agent B

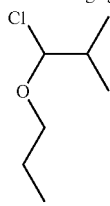

Acetalizing agent C

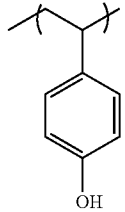

Poly-A

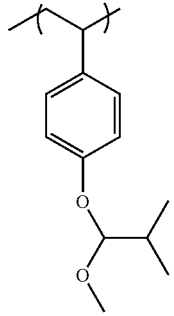

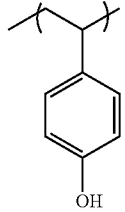

Poly-B

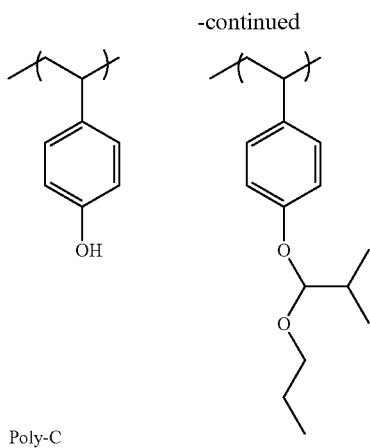

Poly-C

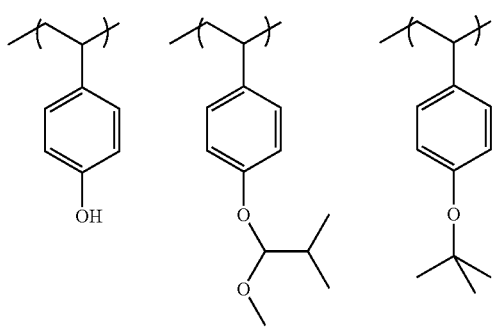

Poly-D

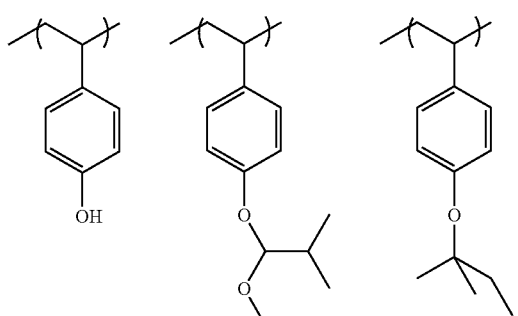

Poly-E

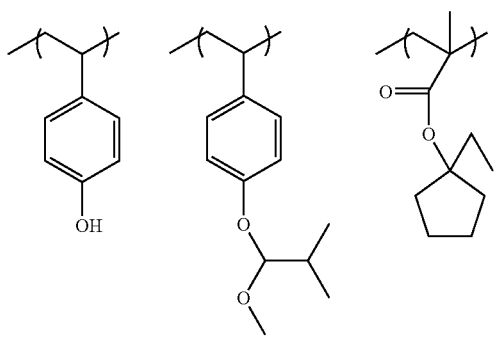

Poly-F

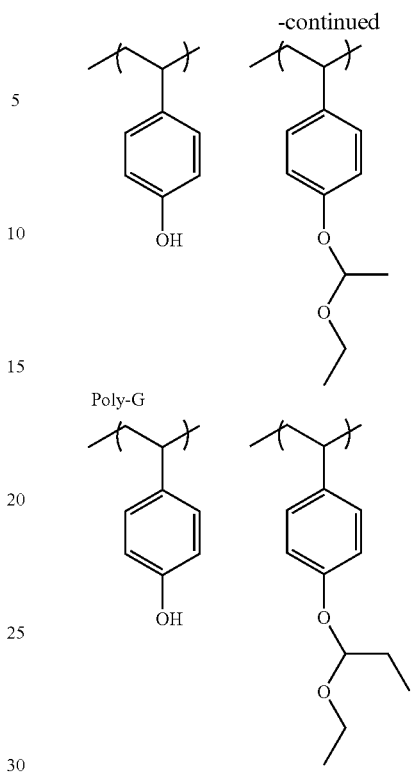

Poly-G

Poly-H

Examples 1-6 & Comparative Examples 1-2

Resist compositions were prepared according to the formulation shown in Tables 1 and 2. The polymers are Poly-A to H obtained in the above Synthesis Examples and Comparative Synthesis Examples, and the remaining components listed in Tables 1 and 2 have the following meaning.

PAG1: (4-butoxyphenyl)diphenylsulfonium 10-camphorsulfonate

PAG2: bis(cyclohexylsulfonyl)diazomethane

Basic compound A: tris(2-methoxyethyl)amine

Surfactant A: FC-430 (Sumitomo 3M Co., Ltd.)

Surfactant B: Surflon S-381 (Asahi Glass Co., Ltd.)

Solvent A: propylene glycol methyl ether acetate

Solvent B: ethyl lactate

TABLE 1

| Component (pbw) | Example | | | |
|---|---|---|---|---|
| | 1 | 2 | 3 | 4 |
| Poly-A | 80 | — | — | — |
| Poly-B | — | 80 | — | — |
| Poly-C | — | — | 80 | — |
| Poly-D | — | — | — | 80 |
| PAG1 | 1 | 1 | 1 | 1 |
| PAG2 | 2 | 2 | 2 | 2 |
| Basic compound A | 0.2 | 0.2 | 0.2 | 0.2 |
| Surfactant A | 0.07 | 0.07 | 0.07 | 0.07 |
| Surfactant B | 0.07 | 0.07 | 0.07 | 0.07 |
| Solvent A | 300 | 300 | 300 | 300 |
| Solvent B | 130 | 130 | 130 | 130 |

TABLE 2

| Component (pbw) | Example 5 | Example 6 | Comparative Example 1 | Comparative Example 2 |
|---|---|---|---|---|
| Poly-E | 80 | — | — | — |
| Poly-F | — | 80 | — | — |
| Poly-G | — | — | 80 | — |
| Poly-H | — | — | — | 80 |
| PAG1 | 1 | 1 | 1 | 1 |
| PAG2 | 2 | 2 | 2 | 2 |
| Basic compound A | 0.2 | 0.2 | 0.2 | 0.2 |
| Surfactant A | 0.07 | 0.07 | 0.07 | 0.07 |
| Surfactant B | 0.07 | 0.07 | 0.07 | 0.07 |
| Solvent A | 300 | 300 | 300 | 300 |
| Solvent B | 130 | 130 | 130 | 130 |

The resist materials thus obtained were filtered through a Teflon® filter having a pore size of 0.1 μm, thereby giving resist solutions. These resist solutions were spin-coated onto silicon wafers, then baked on a hot plate at 100° C. for 90 seconds to give resist films having a thickness of 0.3 μm.

The resist films were exposed using an excimer laser stepper NSR2005EX (Nikon Corp., NA 0.5), then baked at 110° C. for 90 seconds (post-exposure baking: PEB), and developed with a solution of 2.38 wt % tetramethylammonium hydroxide in water, thereby giving positive patterns (Examples 1-6 and Comparative Examples 1-2).

The resulting resist patterns were evaluated as described below.

Resist Pattern Evaluation

The exposure dose which provides a 1:1 resolution at the top and bottom of a 0.13-μm line-and-space pattern was the optimum exposure dose (sensitivity Eop). The minimum line width of a line-and-space pattern which was ascertained separate at this dose was the resolution of a test resist. The shape in cross section of the resolved resist pattern was examined under a scanning electron microscope.

The PED stability of a resist was evaluated by effecting post-exposure bake (PEB) after 24 hours of holding from exposure at the optimum dose and determining a variation in line width. The less the variation, the greater is the PED dimensional stability.

The results are shown in Table 3.

TABLE 3

| | Sensitivity (mJ/cm$^2$) | Resolution (μm) | Profile | Dimensional stability on PED after 24 hours (nm) |
|---|---|---|---|---|
| Example 1 | 28 | 0.1 | rectangular | −4 |
| Example 2 | 27 | 0.11 | somewhat round | −6 |
| Example 3 | 25 | 0.12 | somewhat round | −8 |
| Example 4 | 27 | 0.12 | rectangular | −5 |
| Example 5 | 27 | 0.1 | rectangular | −6 |
| Example 6 | 30 | 0.11 | rectangular | −9 |
| Comparative Example 1 | 25 | 0.13 | pattern collapsed | −20 |
| Comparative Example 2 | 26 | 0.13 | pattern collapsed | −18 |

Resist compositions comprising as the base resin a polymer having alkoxyisobutoxy groups as a reactive group which is decomposable under the action of an acid to increase solubility in alkali have advantages including a significantly enhanced contrast of alkali dissolution rate before and after exposure, a high sensitivity, and a high resolution even in a fine size region where conventional ethoxyethoxystyrene and ethoxypropoxystyrene fail due to collapse of pattern shapes when resist films are made thin. The compositions are best suited as a chemically amplified resist material for micropatterning in the manufacture of VLSI.

Japanese Patent Application No. 2003-147140 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a polymer comprising recurring units of the following general formula (1) and having a weight average molecular weight of 1,000 to 500,000,

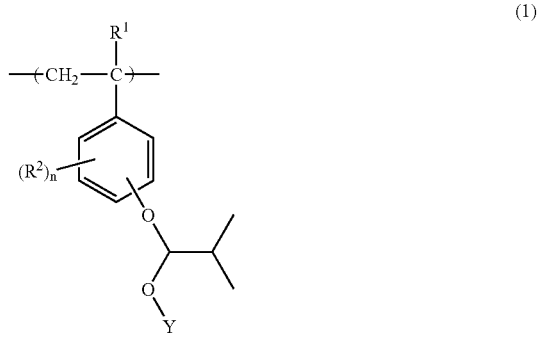

wherein $R^1$ is hydrogen, hydroxy, a straight or branched alkyl group, halogen atom or trifluoromethyl group, $R^2$ is hydrogen, hydroxy, a halogen atom or trifluoromethyl group, Y is methyl, ethyl or propyl, and n is 0 or a positive integer of 1 to 4.

2. A resist composition comprising a polymer comprising recurring units of the following general formula (2) and having a weight average molecular weight of 1,000 to 500,000,

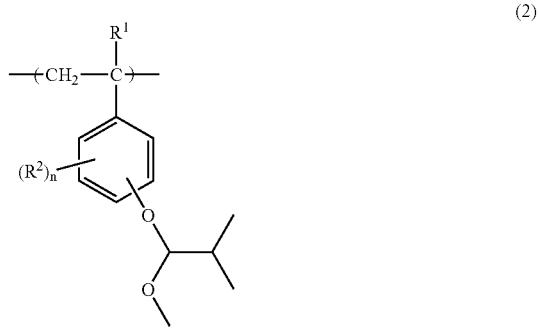

wherein $R^1$ is hydrogen, hydroxy, a straight or branched alkyl group, halogen atom or trifluoromethyl group, $R^2$ is hydrogen, hydroxy, a halogen atom or trifluoromethyl group, and n is 0 or a positive integer of 1 to 4.

3. A resist composition comprising a polymer comprising recurring units of the following general formula (3) and having a weight average molecular weight of 1,000 to 500,000, (3)

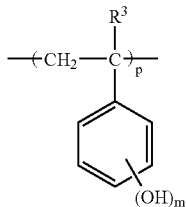 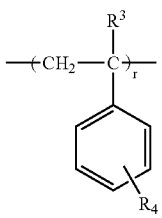 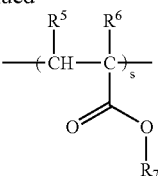

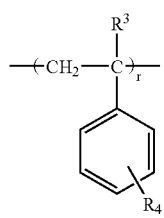 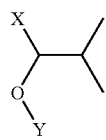

wherein each of $R^1$ and $R^3$ is hydrogen, hydroxy, a straight or branched alkyl group, halogen atom or trifluoromethyl group, $R^2$ is hydrogen, hydroxy, a halogen atom or trifluoromethyl group, $R^4$ is hydrogen, a substituted or unsubstituted alkyl group, substituted or unsubstituted alkoxy group or ditrifluoromethylhydroxymethyl group, $R^5$ is hydrogen or methyl, $R^6$ is a hydrogen atom, methyl group, alkoxycarbonyl group, cyano group, halogen atom, or trifluoromethyl group, $R^7$ is a $C_4$-$C_{30}$ alkyl group, n is 0 or a positive integer of 1 to 4, m is 0 or a positive integer of 1 to 5, r and s are 0 or positive numbers, and p and q are positive numbers.

5. A resist composition comprising a polymer obtained by the reaction under basic conditions of a phenolic resin with a compound of the following general formula (5):

(5)

wherein each of $R^1$ and $R^3$ is hydrogen, hydroxy, a straight or branched alkyl group, halogen atom or trifluoromethyl group, $R^2$ is hydrogen, hydroxy, a halogen atom or trifluoromethyl group, $R^4$ is hydrogen, a substituted or unsubstituted alkyl group, substituted or unsubstituted alkoxy group or ditrifluoromethylhydroxymethyl group, $R^5$ is hydrogen or methyl, $R^6$ is a hydrogen atom, methyl group, alkoxycarbonyl group, cyano group, halogen atom, or trifluoromethyl group, $R^7$ is a $C_4$-$C_{30}$ alkyl group, Y is methyl, ethyl or propyl, n is 0 or a positive integer of 1 to 4, m is 0 or a positive integer of 1 to 5, r and s are 0 or positive numbers, and p and q are positive numbers.

4. A resist composition comprising a polymer comprising recurring units of the following general formula (4) and having a weight average molecular weight of 1,000 to 500,000, (4)

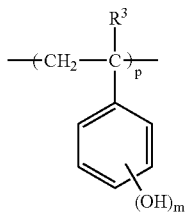 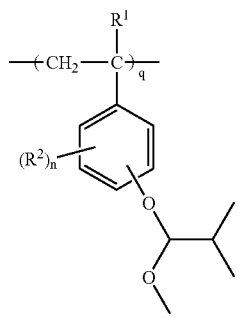

wherein X is a chlorine, bromine or iodine atom and Y is methyl, ethyl or propyl.

6. A chemically amplified positive resist composition comprising
   (A) an organic solvent,
   (B) the polymer of claim 1 as a base resin, and
   (C) a photoacid generator.

7. A chemically amplified positive resist composition comprising
   (A) an organic solvent,
   (B) the polymer of claim 1 as a base resin,
   (C) a photoacid generator, and
   (D) a dissolution inhibitor.

8. The chemically amplified positive resist composition of claim 6 further comprising (E) a basic compound.

9. A process for forming a resist pattern comprising the steps of:
   applying the resist composition of claim 6 onto a substrate to form a coating,
   heat treating the coating and then exposing it to high-energy radiation or electron beam through a photo mask, and
   optionally heat treating the exposed coating and developing it with a liquid developer.

* * * * *